(12) United States Patent
Kondo

(10) Patent No.: US 6,936,864 B2
(45) Date of Patent: Aug. 30, 2005

(54) SEMICONDUCTOR LIGHT EMITTING ELEMENT

(75) Inventor: Katsufumi Kondo, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/780,534

(22) Filed: Feb. 17, 2004

(65) Prior Publication Data

US 2004/0184499 A1 Sep. 23, 2004

(30) Foreign Application Priority Data

Feb. 17, 2003 (JP) ........................................ 2003-037800

(51) Int. Cl.⁷ .............................................. H01L 33/00
(52) U.S. Cl. ........................... 257/103; 257/79; 257/94; 257/96
(58) Field of Search ................. 257/79–103; 372/43–50

(56) References Cited

U.S. PATENT DOCUMENTS

| | | | | |
|---|---|---|---|---|
| 5,128,951 | A | * 7/1992 | Karpinski | ................. 372/50 |
| 5,345,092 | A | * 9/1994 | Kurihara | ..................... 257/13 |
| 6,229,160 | B1 | 5/2001 | Krames et al. | |
| 6,242,761 | B1 | * 6/2001 | Fujimoto et al. | ............. 257/94 |
| 6,434,178 | B1 | * 8/2002 | Ubukata | ........................ 372/45 |
| 6,528,823 | B2 | * 3/2003 | Akaike et al. | ............... 257/779 |
| 6,567,449 | B1 | * 5/2003 | Ashida | ........................ 372/50 |
| 2003/0173571 | A1 | * 9/2003 | Kish et al. | ..................... 257/85 |
| 2004/0061101 | A1 | * 4/2004 | Noto et al. | ..................... 257/13 |

FOREIGN PATENT DOCUMENTS

| | | | | |
|---|---|---|---|---|
| JP | 2001068785 | A | * 3/2001 | ............. H01S/5/22 |
| JP | 200022322005 | A | * 8/2002 | ............ H01L/33/00 |
| JP | 2003-086838 | | 3/2003 | |
| JP | 2003-179253 | | 6/2003 | |

OTHER PUBLICATIONS

Yamada et al, "Surface Emitting GaAs Light–Emitting Diode/Laser Diode with Modified Coaxial Transverse Junction (CTJ) Structure", Electronics Letters, vol. 24, No. 2 (1988), pp. 77–78.*

M. Levinshteyn, "Handbook of Semiconductor Parameters", vol. 1, World Scientific, Singapore 1996, Reprinted 2000: p. 104–105 and 169–170.*

M. Levinshteyn, "Handbook of Semiconductor Parameters", vol. 2, World Scientific, Singapore 1999, Reprinted 2000, p. 104–105 and 169–170.*

S.M. Sze, "Modern Semiconductor Device Physics", John Wiley & Sons, New York 1998, Appendix G, pp. 539–540.*

* cited by examiner

Primary Examiner—Nathan J. Flynn
Assistant Examiner—Johannes Mondt
(74) Attorney, Agent, or Firm—Hogan & Hartson, LLP

(57) ABSTRACT

A semiconductor light emitting element comprising: a first layer; a semiconductor light emitting layer; a current blocking layer; a second layer; a first electrode; and a second electrode is provided. The semiconductor light emitting layer is selectively provided on the first layer. The current blocking layer of high resistance is provided around the semiconductor light emitting layer on the first layer. The second layer is provided on the semiconductor light emitting layer and the current blocking layer. The first electrode is provided on the second layer. The second electrode is provided on the back of the first layer. A part of a light emitted from the semiconductor light emitting layer is emitted outside through the first layer, and a part of the light emitted from the semiconductor light emitting layer is emitted outside through the second layer.

22 Claims, 17 Drawing Sheets

SEMICONDUCTOR LIGHT EMITTING ELEMENT

CROSS-REFERENCE TO RELATED APPLICATIONS

This application is based upon and claims the benefit of priority from the prior Japanese Patent Application No. 2003-037800, filed on Feb. 17, 2003, the entire contents of which are incorporated herein by reference.

BACKGROUND OF THE INVENTION

The present invention relates to a semiconductor light emitting element, and more particularly, it relates to a semiconductor light emitting element, such as a light emitting diode (LED), from which the light emitted by supplying a current can be extracted.

The semiconductor light emitting elements have many advantages of such as being compact in size, having low power consumption and being excellent in reliability. Therefore, the semiconductor light emitting elements have been widely used for various uses which demand high emission luminosity such as a display board intended for use indoors or outdoors, a railroad/traffic signal light and various equipment mounted in a vehicle.

For example, the light can be emitted within the broad wavelength range from red to green, by adjusting the composition of the light emitting layer made of InGaAlP quaternary compound semiconductors in the semiconductor light emitting element.

In this specification, the "InGaAlP compound semiconductor" may include all semiconductors having the composition ratios x and y in composition formula $In_xGa_yAl_{1-x-y}P$ in a range of $0 \leq x \leq 1$, $0 \leq y \leq 1$, where $(x+y) \leq 1$.

Currently, the semiconductor light emitting element using one of gallium nitride (GaN) compound alloy system as a material of the light emitting layer which has the wavelength range from blue to ultraviolet has been developed. Since this material has a band structure of a direct transition, high efficiency of the light extraction can be acquired in the semiconductor light emitting element made of the material. In this specification, the "gallium nitride (GaN) compound semiconductor" may include all semiconductors with the composition ratios x, y and z in a composition formula $B_{1-x-y-z}In_xAl_yGa_zN$ in a range of $x \leq 1$, $y \leq 1$, $z \leq 1$, $x+y+z \leq 1$. For example, InGaN (x=0.4, y=0, z=0.6) is included in "gallium nitride compound semiconductor".

FIG. 15 is a schematic diagram showing a cross-sectional structure of a conventional light emitting diode. That is, this light emitting diode has the "double-hetero type" structure where a lower cladding layer 102, an active layer 103, an upper cladding layer 104, and a window layer 105 are laminated in this order on a substrate 101. An upper electrode 106 is provided on the window layer 105, and a lower electrode 107 is provided on the backside of the substrate 101. The current I can be injected into the active layer 103 through these electrodes 106 and 107 as shown by the arrows or in a direction opposite to the arrows.

In the case of "double-hetero type" structure, the upper cladding layer 102 and the lower cladding layer 104 consist of semiconductors which have wider bandgap than the active layer 103. Thus, it is possible to acquire high light emitting efficiency by confining the carriers injected through the electrodes 106 and 107 in the active layer 103.

However, the Inventor has found that in the case of the light emitting diode having such a structure, it might be a problem that a part of emission produced in the active layer 103 could not be extracted outside the element.

FIG. 16 is a schematic diagram for explaining the extraction paths of the emission produced in the active layer 103. As illustrated in this figure, the emission L11 emitted upward from the active layer 103 can be extracted outside through the cladding layer 104 and the window layer 105. The emission L12 emitted downward in a slanting direction from the active layer 103 can also be extracted outside through the cladding layer 102. The emissions extracted outside the element can be gathered in a predetermined direction by a light condensing means, such as a reflector which is not illustrated.

In contrast, the emission L13 emitted downward from the active layer 103 passes through the cladding layer 102 and the substrate 101, and is reflected by the lower electrode 107. However, there is a problem that the reflectance of the emission L13 is not necessarily high, since an alloyed region is formed near the boundary between the electrode and the semiconductor layer in many semiconductor light emitting elements in order to obtain an ohmic contact. That is, it is not easy to extract the emission L13 emitted towards the lower electrode 107 from the active layer 103 outside with a sufficiently high efficiency since the emission is absorbed in the alloyed region.

The emission L14 which is emitted from the active layer 103 and reaches the side surface of the element with a shallow incident angle may be reflected inside the element. This is because a total reflection of light arises in the case where the refractive index of the material which constitutes the element, such as the substrate 101 is higher than that of the outside media (for example, the atmosphere, nitrogen gas, etc.). If such a total reflection occurs, the problem that the emission L14 is confined inside the element and is absorbed in the alloyed region with the electrode and the active layer 103 and is attenuated arises.

Moreover, the Inventor has found there was a problem that a part of emission produced inside the active layer 103 could not be extracted outside the active layer 103.

FIG. 17 is a schematic diagram for explaining the extraction paths of the emission produced inside the active layer. For example, when the emission is produced in the light emitting point EP inside the active layer 103, the part of the emission L15 emitted upward can be extracted from the active layer 103 through the cladding layer 104. In contrast to this, the part of the emission L16 emitted in a slanting direction inside the active layer 103 from the light emitting point EP may be total-reflected on the interface with the cladding layer 104. This is because the active layer 103 has a higher refractive index than the cladding layer 104.

If such total reflection arises, the emission L16 may be confined and guided inside the active layer 103, and may be lost by an absorption.

The critical angle θc at which such total reflection arises may be about 60 degrees, when the difference between the refractive index of the active layer 103 and that of the cladding layer 104 is 0.5. In such a case, about ⅓ of the light emitted from the light emitting point EP may be total-reflected on the interface with the cladding layer 104, and may be confined and guided inside the active layer, and may be lost by an absorption.

As explained above, in the conventional semiconductor light emitting element, the efficiency with which the light emitted from the active layer is extracted outside is not necessarily high. Furthermore, there has also been a problem that a part of emission produced in the active layer may be confined inside the active layer and be lost.

SUMMARY OF THE INVENTION

According to an aspect of the invention, there is provided a semiconductor light emitting element comprising: a first layer; a semiconductor light emitting layer selectively provided on the first layer; a current blocking layer of high resistance provided around the semiconductor light emitting layer on the first layer; a second layer provided on the semiconductor light emitting layer and the current blocking layer; a first electrode provided on the second layer; and a second electrode provided on the back of the first layer, a part of a light emitted from the semiconductor light emitting layer being emitted outside through the first layer, and a part of the light emitted from the semiconductor light emitting layer being emitted outside through the second layer.

According to other aspect of the invention, there is provided a semiconductor light emitting element comprising: a first layer; a plurality of semiconductor light emitting layers selectively provided on the first layer, the semiconductor light emitting layers being separated from each other; a current blocking layer of high resistance provided among the semiconductor light emitting layers on the first layer; a second layer provided on the semiconductor light emitting layer and the current blocking layer; a first electrode provided on the second layer; and a second electrode provided on the back of the first layer, a part of a light emitted from the semiconductor light emitting layers being emitted outside through the first layer, and a part of the light emitted from the semiconductor light emitting layers being emitted outside through the second layer.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Referring to drawings, some embodiments of the present invention will now be described in detail.

Figure 1:
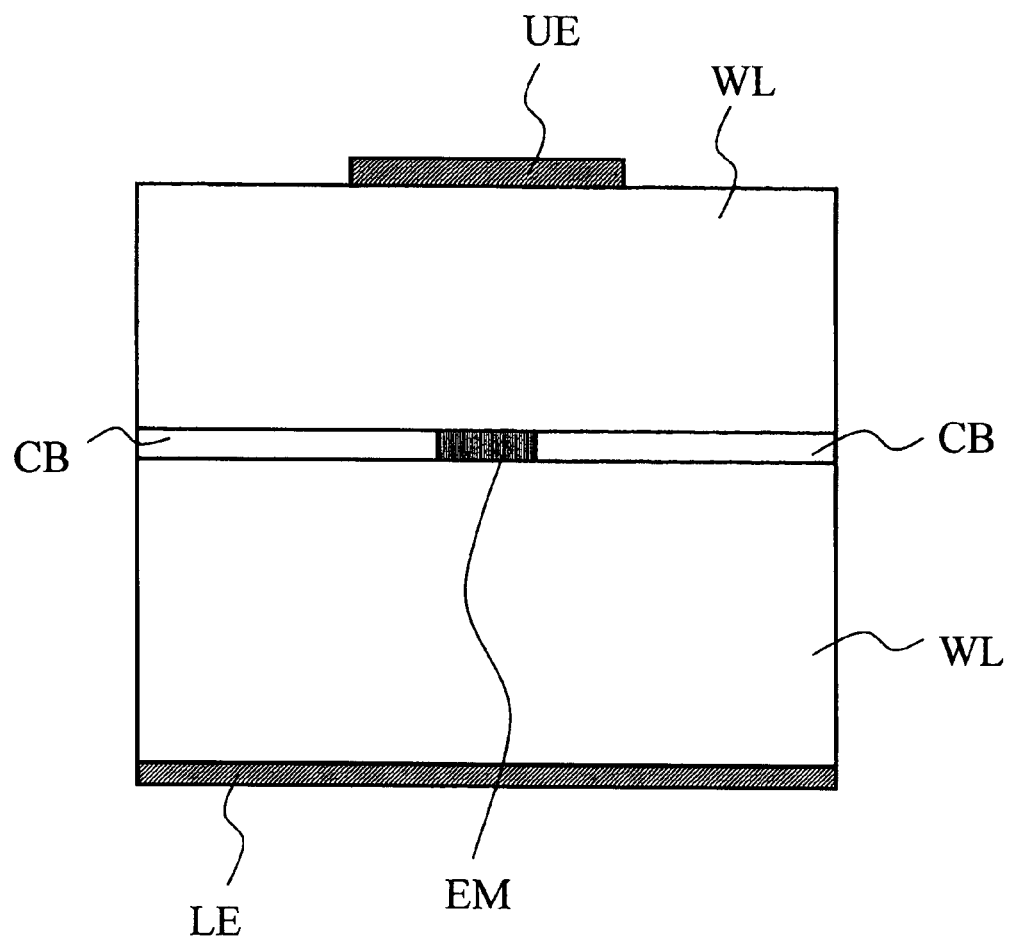
FIG. 1 is a schematic diagram showing the cross-sectional structure of the semiconductor light emitting element according to the first embodiment of the invention.

FIG. 1 is a schematic diagram showing the cross-sectional structure of the semiconductor light emitting element according to the first embodiment of the invention. That is, the semiconductor light emitting element of this embodiment has a structure where the transparent layers WL are provided on and under the light emitting layer (active layer) EM, respectively. The light emitting layer EM is patterned in a smaller size than the plane size of the whole element. And the light emitting layer EM is surrounded by a current blocking layer CB. And, an upper electrode UE is provided on the transparent layer WL, and the lower electrode LE is provided under the transparent layer WL. A "double-hetero type" structure may be formed by providing the cladding layers, which are not illustrated, on and under the light emitting layer EM, respectively.

The upper and lower transparent layers WL may be made of semiconductors or other conductive materials. That is, the transparent layers WL may be a semiconductor substrate, or may be formed by growing a semiconductor layer epitaxially, for example. Furthermore, the whole or a part of the transparent layers WL may be made of conductive materials other than semiconductors. Specifically, the transparent layers WL may be constituted by sticking conductive plastics etc. on the semiconductor layers.

In the case of this semiconductor light emitting element, the emission arises by supplying current into the light emitting layer EM through the upper electrode UE and the lower electrode LE. In this case, since the current blocking layer CB is provided in the surrounding of the light emitting layer EM, the current can be concentrated on the light emitting layer EM. And according to this embodiment, the light extraction efficiency can be improved than the conventional light emitting element by providing the light emitting layer EM near the center of the element.

Figure 2:
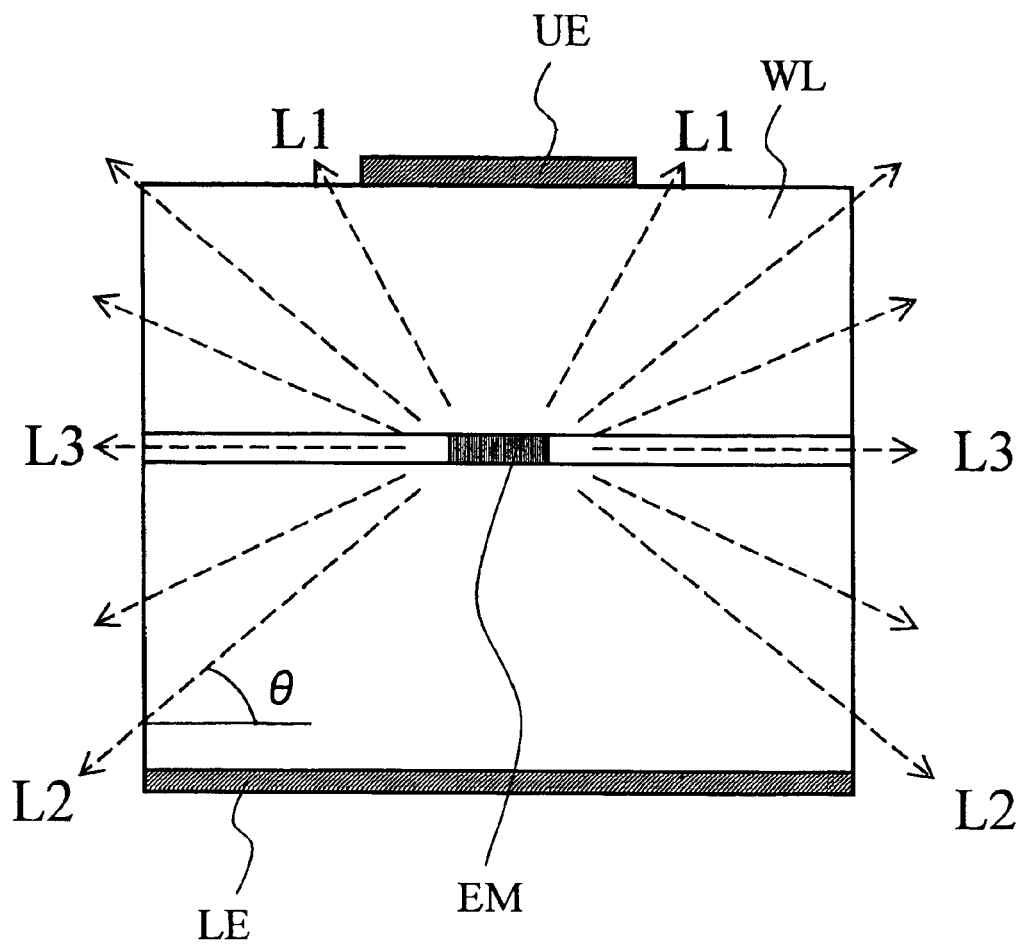
FIG. 2 is a schematic diagram for explaining the light extraction paths from the light emitting layer EM.

FIG. 2 is a schematic diagram for explaining the light extraction paths from the light emitting layer EM. For example, the emission L1 emitted upward from the light emitting layer EM can be extracted from the surrounding of the upper electrode UE through the upper transparent layer WL.

Figure 16:
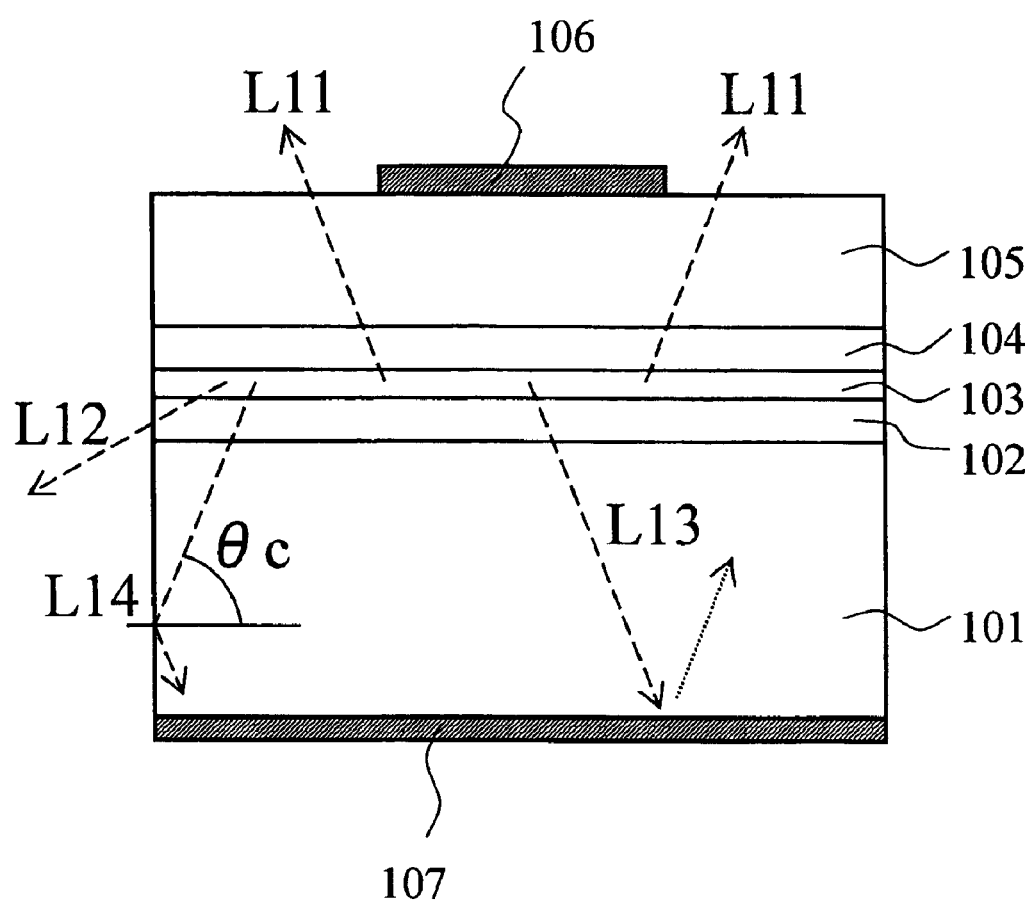
FIG. 16 is a schematic diagram for explaining the extraction paths of the emission produced in the active layer 103.

On the other hand, the emission L2 emitted downward in a slanting direction from the light emitting layer EM can be extracted outside the element through the lower transparent layer WL. Here, since the light emitting layer EM is patterned in a smaller size than the plane size of the element, the emission L2 emitted from the light emitting layer EM can reach the side surface of the element in a direction nearly perpendicular thereto. That is, the incidence angle θ of the emission L2 expressed in FIG. 2 can be made smaller, as is apparent comparing with FIG. 16. Consequently, the total reflection of the emission L2 on the side surface of the element can be suppressed, and the emission L2 can be extracted outside. In addition, the same effect is obtained not only on the side of the light emitting element but also on all the boundary surfaces between the light emitting element and the outside such as the upper surface and the lower surface.

Figure 17:
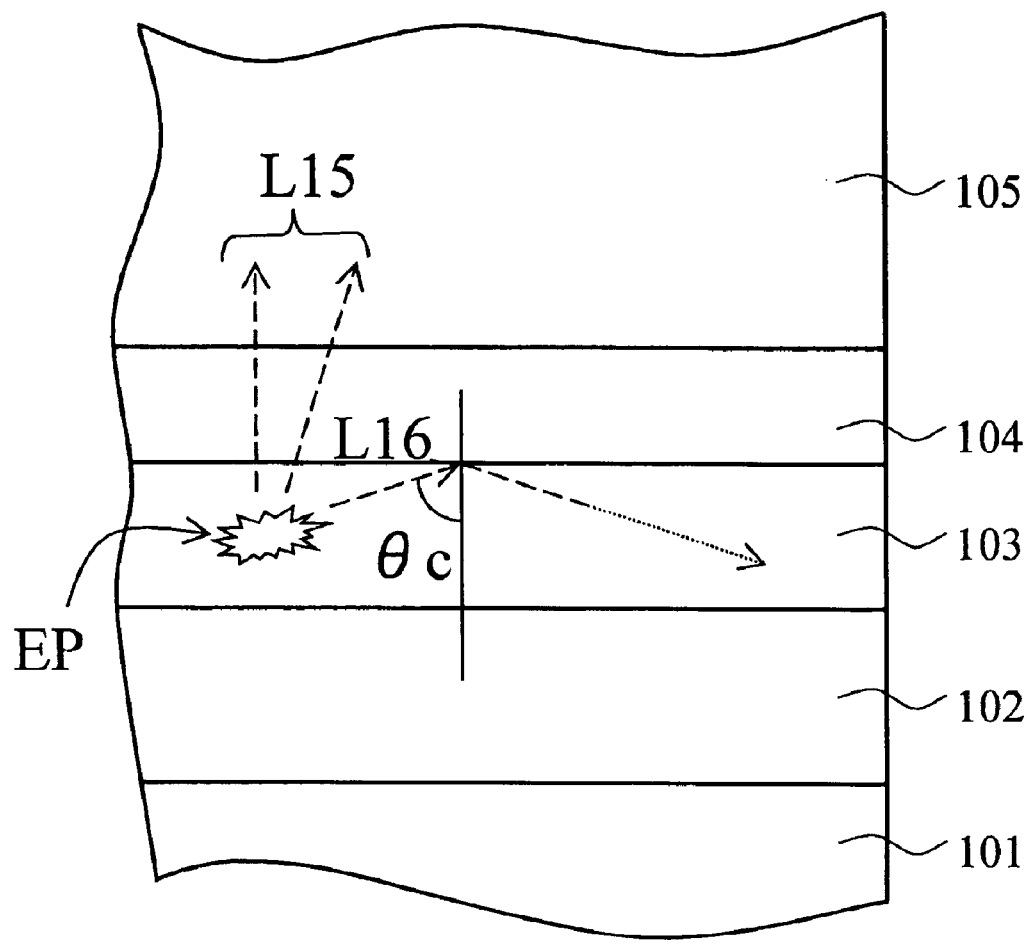
FIG. 17 is a schematic diagram for explaining the extraction paths of the emission produced inside the active layer.

Furthermore, since the light emitting layer EM is patterned in a small size, the emission L3 which has been confined and guided inside the light emitting layer can be extracted from the side surface (facet) of the light emitting layer EM, as mentioned above about FIG. 17. That is, the path of the guided light inside the light emitting layer EM can be shortened, and the loss with the absorption can be reduced by patterning the light emitting layer EM in a small size.

The emissions L1 through L3 emitted outside the light emitting element can be gathered in a predetermined direction by using a light condensing means, such as a reflector (not shown) provided in the surrounding of the element. As a result, higher light extraction efficiency can be realized than before.

Since the distance between the light emitting layer EM and the upper electrode UE, and the distance between the light emitting layer EM and the lower electrode LE can be made longer by forming the upper and lower transparent layers WL thicker, the rate of the obstruction to the emission by these electrodes can be reduced. A wafer bonding technology can be mentioned as a method of forming the thicker transparent layer WL, as will be explained in full detail later.

As explained above, according to this embodiment, the light extraction efficiency emitted outside the element from the light emitting layer EM can be improved by forming the light emitting layer EM in a small size near the center of the semiconductor light emitting element. That is, according to this embodiment, the light emitting element having a structure where a "point light source" with high luminosity is arranged near the center of the light emitting element can be obtained. With such a structure, the total reflection of the emitted light on the surface of the element can be suppressed, and the light extraction efficiency can be improved.

Furthermore, according to this embodiment, the emissions which have been confined and guided inside the light emitting layer in the conventional elements can be extracted from the side surfaces of the light emitting layer EM. In this case, by patterning the light emitting layer EM in a small size, it becomes possible to suppress the absorption of the emissions which are guided in the light emitting layer and to extract the lights with high intensity.

In this embodiment, the plan form of the light emitting layer EM can be made into various kinds of pattern form including a circular, a polygon, and an ellipse. Moreover, the size and the position can be appropriately determined. For example, the light emitting layer EM does not necessarily need to be provided near the center of the element, and may be provided in a position far from the center according to the structure of the element.

Figure 3:
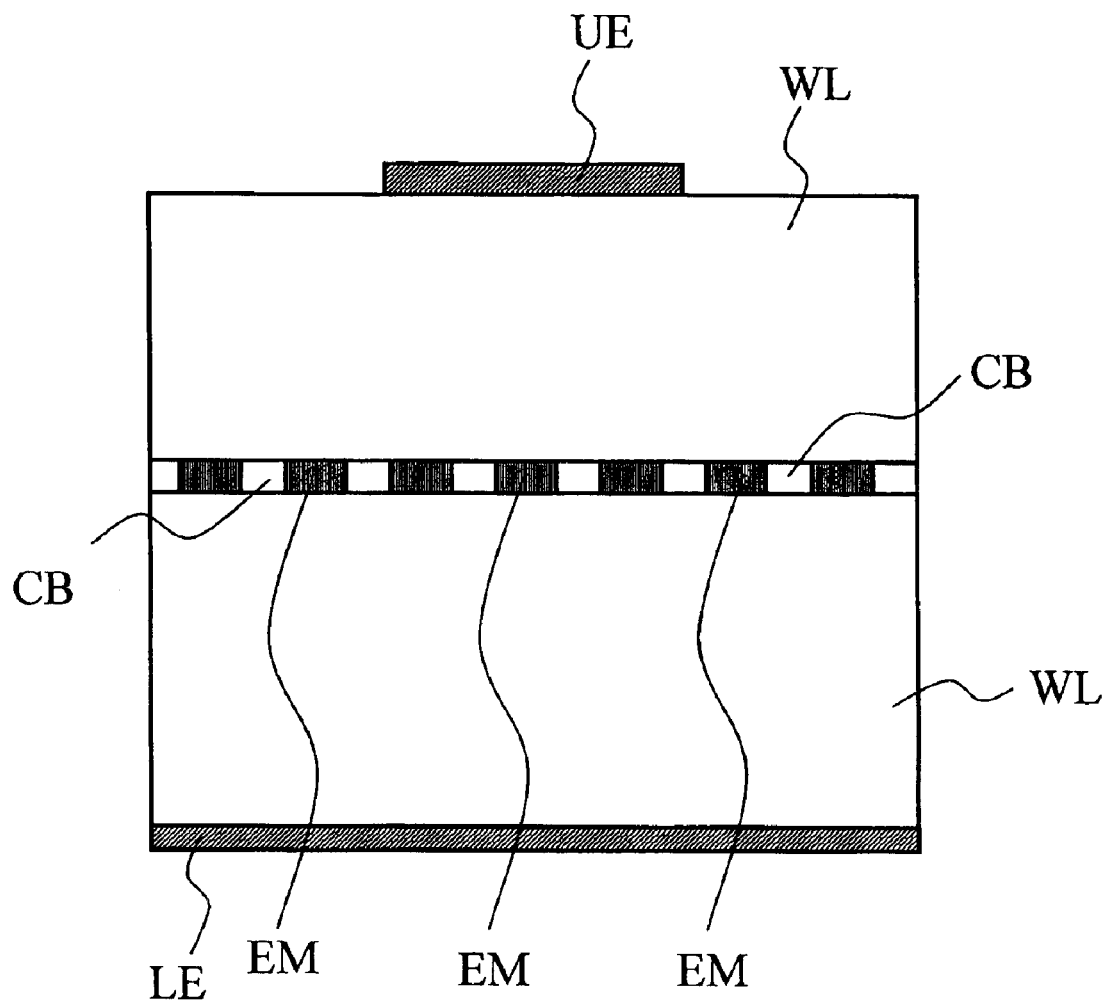
FIG. 3 is a schematic diagram illustrating the cross-sectional structure of the semiconductor light emitting element according to the second embodiment of the invention.

Next, the second embodiment of the invention will be explained. FIG. 3 is a schematic diagram illustrating the cross-sectional structure of the semiconductor light emitting element according to the second embodiment of the invention. The same symbols are given to the same elements as what were mentioned above with reference to FIG. 1 and FIG. 2 about this figure, and detailed explanation will be omitted.

In this embodiment, a plurality of the light emitting layers (active layers) EM are formed in small islands. The current blocking layer CB surrounds these light emitting layers EM. Therefore, the current can be concentrated on the light emitting layers EM. In this way, the current injected through the upper and lower electrodes UE and LE can be concentrated on the light emitting layers EM, and emissions of high efficiency can be obtained.

And it becomes possible to extract the light with higher efficiency by arranging the point sources of light which have high luminosity inside the element.

Figure 4:
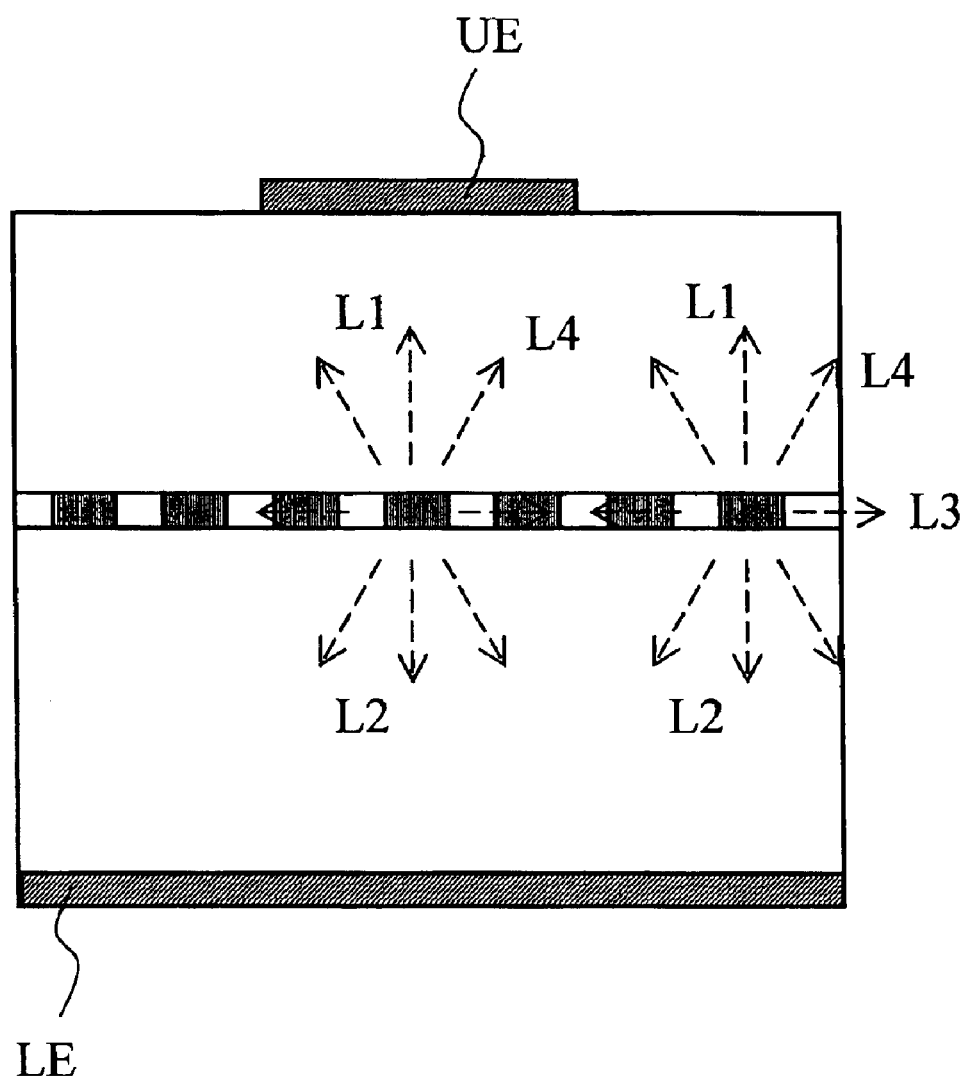
FIG. 4 is a schematic diagram explaining the extraction paths of the light in the semiconductor light emitting element of this embodiment.

FIG. 4 is a schematic diagram explaining the extraction paths of the light in the semiconductor light emitting element of this embodiment. In this embodiment, all of the light emitting layers EM provided inside the element act as light sources. And these light emitting layers EM emit towards the surrounding, respectively.

For example, as for the light emitting layer EM provided directly below the upper electrode UE, although the emission L1 emitted substantially upward is obstructed by the upper electrode UE, the emission L4 emitted upward in a slanting direction can be extracted from the upper surface of the element without being obstructed by the upper electrode UE.

On the other hand, as for the light emitting layer EM provided near the edge of the element, the emission L1 emitted substantially upward can be extracted without being obstructed by the electrode. However, the emission L4 emitted upward in a slanting direction may be total-reflected on the side surface. On the other hand, the emission L3 emitted from the sides of this light emitting layer EM can be extracted outside the element without being obstructed.

Thus, it becomes possible to compensate the gain and loss according to the position of each light emitting layers EM by providing a plurality of light emitting layers EM inside the element. Consequently, it becomes possible as the whole element to improve the light extraction efficiency further.

In addition, in this embodiment, the plan forms, the sizes, the arrangement relations, etc. of the plurality of light emitting layers EM can be appropriately determined by considering the structure and the characteristics demanded with the light emitting element.

Figure 5A:
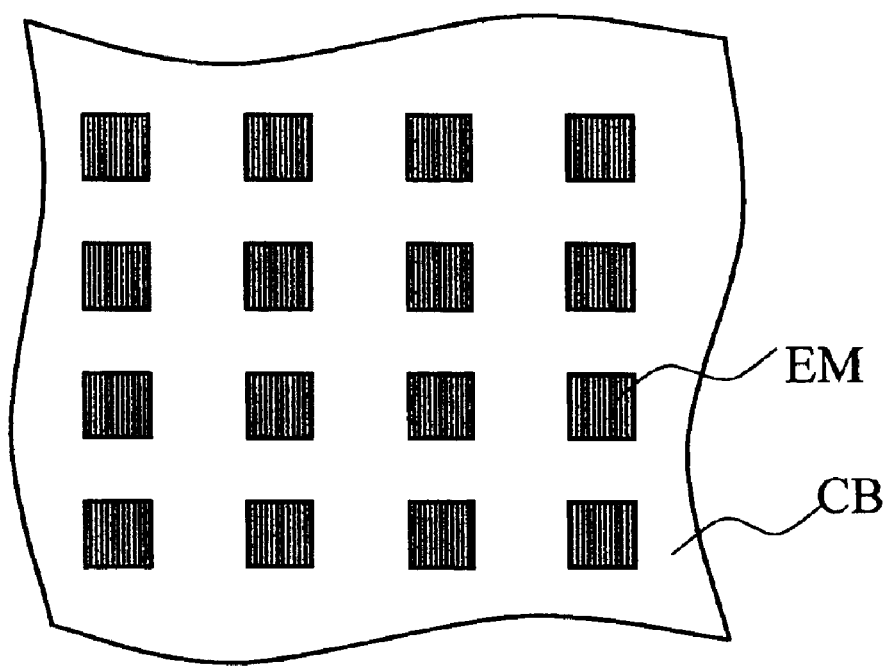
FIG. 5A and FIG. 5B are schematic diagrams which illustrate the plan forms and the arrangement relations of the light emitting layers EM in the second embodiment.
Figure 5B:
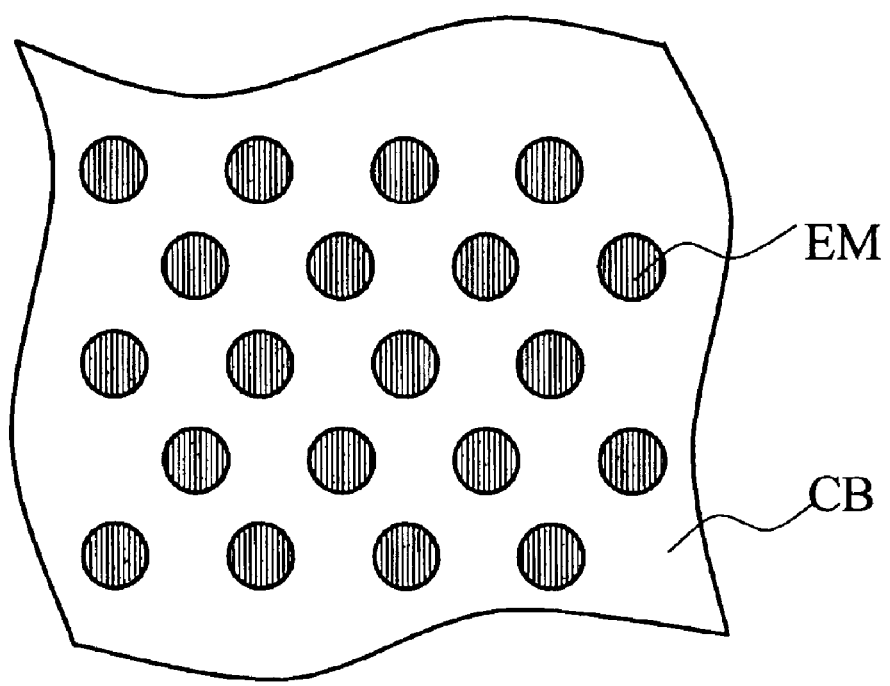

FIG. 5A and FIG. 5B are schematic diagrams which illustrate the plan forms and the arrangement relations of the light emitting layers EM in the second embodiment.

For example, as expressed in FIG. 5A, the light emitting layers EM of substantially rectangles may be arranged in an equal distance. On the other hand, as expressed in FIG. 5B, the light emitting layers EM of substantially round shape may be arranged in a staggered fashion. Other than these examples, plane forms of a plurality of light emitting layers EM can be made into various kinds of form including a circular, an ellipse form, and a polygon. Moreover, also about the arrangement of these light emitting layers EM, the light emitting layers EM may be arranged in an equal spacing. Or, the spaces between the light emitting layers EM may be changed according to the positions of the light emitting layer EM.

Figure 6:
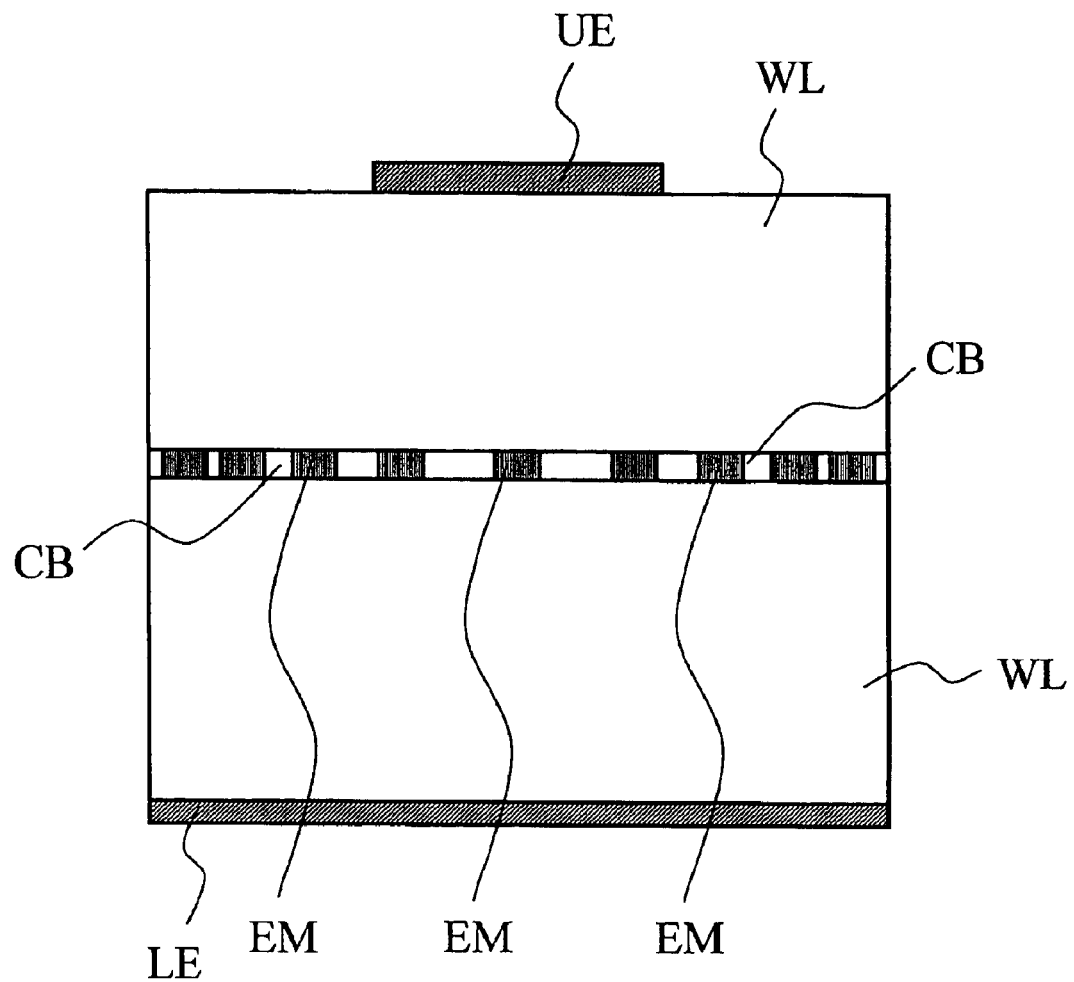
FIG. 6 is a schematic section view illustrating the arrangement relations of the light emitting layers EM in the second embodiment.
Figure 7:
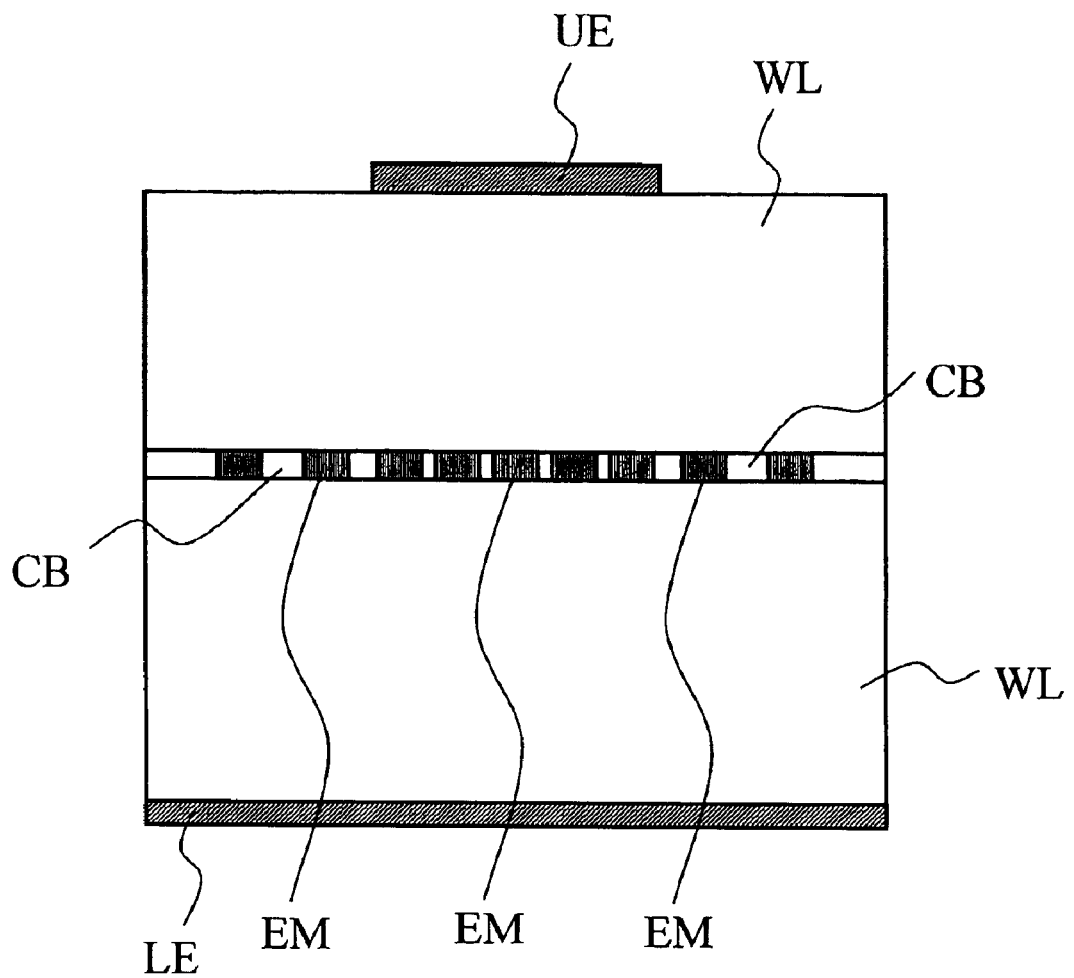
FIG. 7 is a schematic section view illustrating the arrangement relations of the light emitting layers EM in the second embodiment.

FIG. 6 and FIG. 7 are schematic section views illustrating the arrangement relations of the light emitting layers EM in the second embodiment. As illustrated in FIG. 6, the distance between the light emitting layers EM can be made greater near the center of the light emitting element, i.e., sparsely, and, the distance between the light emitting layers EM can be made smaller near the edges of the light emitting element, i.e., densely. In contrast to this example, as expressed in FIG. 7, the distance between the light emitting layers EM can be made smaller near the center of the light emitting element, i.e., densely, and, the distance between the light emitting layers EM can be made greater near the edges of the light emitting element, i.e., sparsely.

The Inventor has evaluated the luminescence intensity by a numerical analysis about one example of this embodiment. That is, as expressed in FIG. 4 and FIG. 5A, a model in which the active layers whose shapes are square islands are arranged in equal intervals has been supposed. The structure where each active layer consists of InGaAlP and InAlP cladding layers sandwiches the active layer was supposed.

The light emitting element (chip) has a square shape having sides of 240 micrometers. And the total area of the active layers of an island fashion was made into 30% of the area of the chip (240×240 square micrometers). In addition, the thicknesses of active layers were made into 0.6 micrometers.

Under the above conditions, the amount of sum total of the light emitted toward surrounding InAlP layers from the active layers of island fashion was calculated by a "ray-tracing method".

Figure 8:
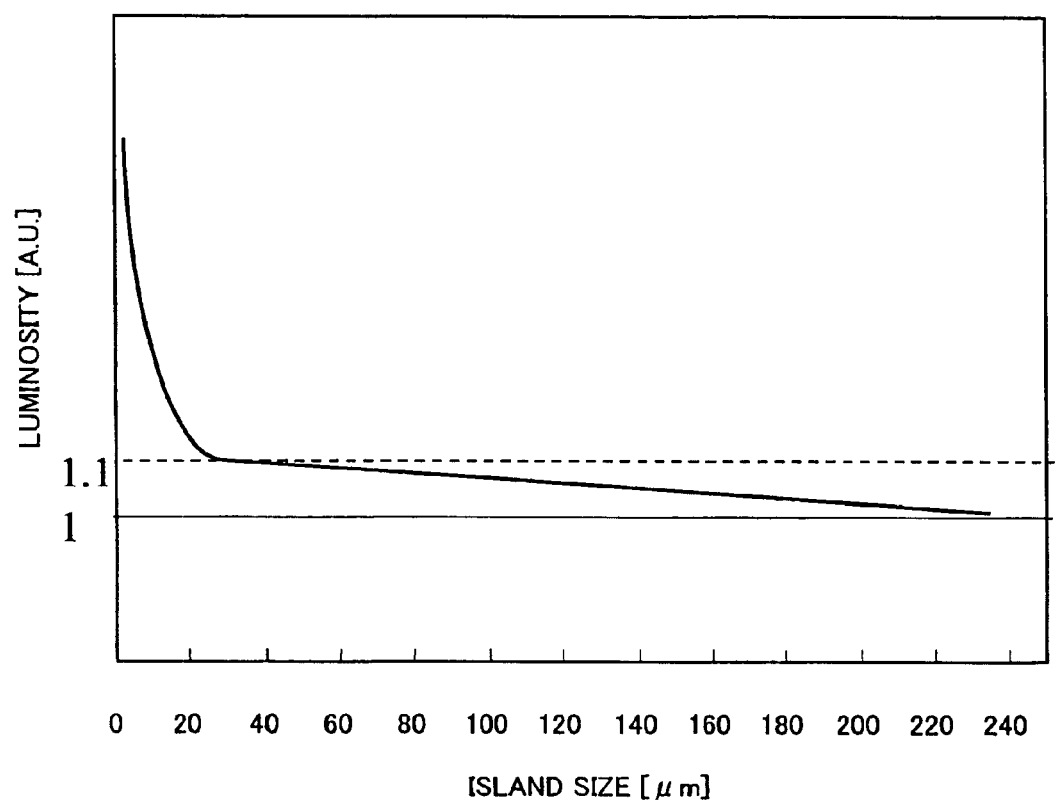
FIG. 8 is a graphical representation showing the relation between the size of the active layers and the luminosity calculated by a ray-tracing method.

FIG. 8 is a graphical representation showing the result of this calculation. That is, the horizontal axis of this figure expresses the size of the active layer (a length of one side), and the vertical axis expresses the luminosity. The luminosity of the vertical axis corresponds to the amount of sum totals of the light emitted from the active layers of island fashion.

From FIG. 8, it is understood that the luminosity rises as the size (island size) of active layers becomes smaller. The luminosity is set to 1 (unity) when the size of the active layers is 240 micrometers (i.e. the active layer is not patterned smaller than the element size). The result shows that the luminosity rises by 10% when the size of the active layer is about 20 micrometers and the luminosity rises rapidly as the size of the active layer becomes still smaller.

That is, when a practical structure of the light emitting diode of InGaAlP is considered, it turned out that a remarkable improvement of luminosity can be obtained if the size of the active layers (a length of one side) is made into 20 micrometers or less.

However, the invention is not limited to the above-mentioned example, but the arrangement relations and intervals of the light emitting layers EM may be appropriately adjusted by considering the structure of the element, for example, the form and the position of the upper electrode UE.

Referring to drawings, some examples of the present invention will now be described in more detail.

FIRST EXAMPLE

Figure 9:
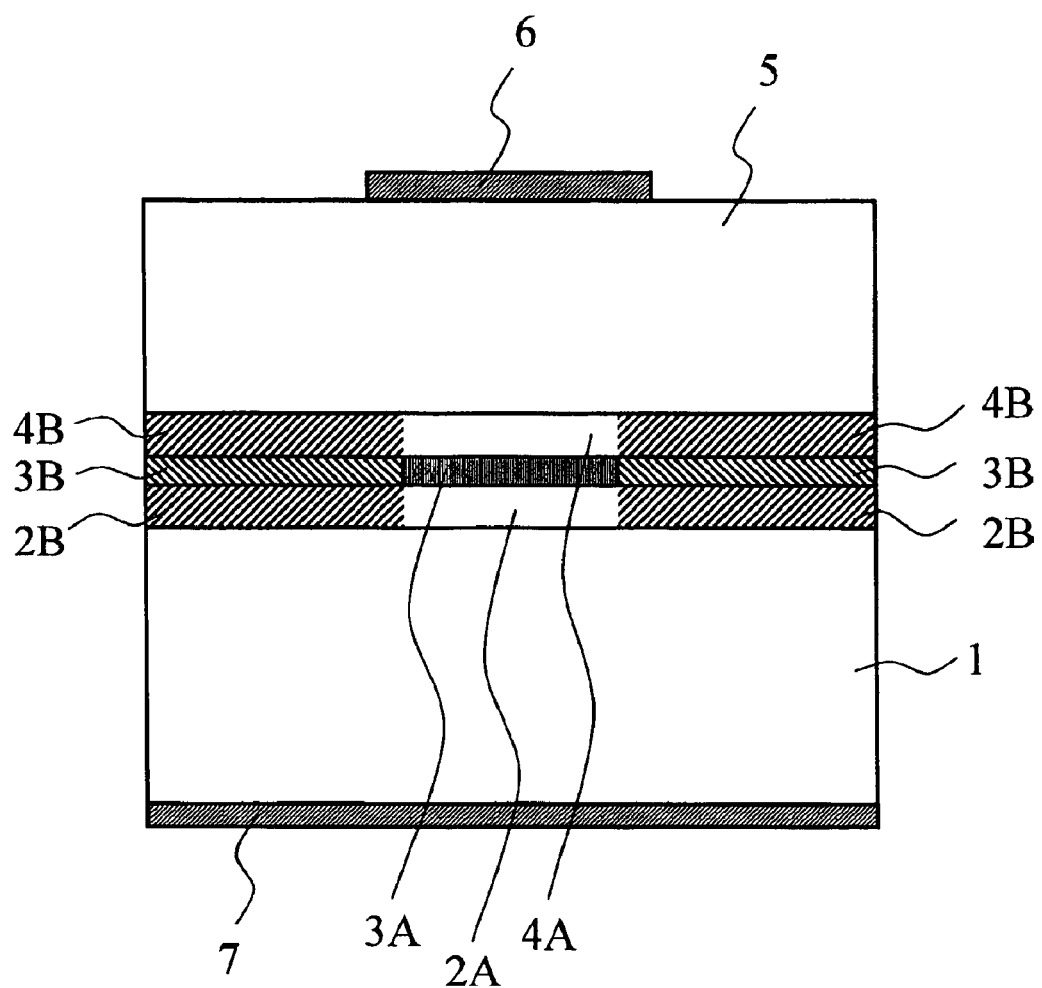
FIG. 9 is a schematic diagram showing the cross-sectional structure of the semiconductor light emitting element according to the first example of the invention.

FIG. 9 is a schematic diagram showing the cross-sectional structure of the semiconductor light emitting element according to the first example of the invention. That is, the light emitting element of this example has the structure where the GaP substrate 1, the InAlP cladding layers 2A and 2B, the InGaAlP active layers 3A and 3B, the InAlP cladding layers 4A and 4Bandgap window layer 5 are laminated in this order. Oxygen, a proton, etc. are introduced into the cladding layer 2B, the active layer 3B, and the cladding layer 4B. And the cladding layer 2B, the active layer 3B, and the cladding layer 4B are of high resistance. The current is injected into the active layer 3A through the upper electrode 6 and the lower electrode 7, and emission arises.

In the element of this example, current can be concentrated on the active layer 3A located near the center by forming the surrounding of the element of the double-heterostructure into high resistance. Since the emissions produced in the active layer 3A are emitted to the surrounding and reach the surfaces of the element in a direction near perpendicular to the surfaces as mentioned above about FIG. 2. therefore, a total reflection becomes hard to occur and the light extraction efficiency outside the element can be improved.

Here, the cladding layers and the active layers can be made by a crystal growth using MOCVD (Metal-Organic Chemical Vapor Deposition) method. And since the substrate 1 and the window layer 5 can be made transparent to the light emitted from the active layer 3A by using GaP as a material of the substrate 1 and the window layer 5, the absorption can be suppressed. However, since the lattice constant of the semiconductor of GaAs (or InGaAlP) alloy system greatly differs from the lattice constant of GaP, the double-heterostructure is hard to be grown directly on the GaP substrate.

Then, the double-heterostructure is firstly grown up on a GaAs substrate which is not illustrated, and wafer bonding process can be carried out in order to bond the double-heterostructure and a GaP substrate 1. Then, the GaAs substrate can be removed by etching, and a further wafer bonding or a crystal growth is carried out in order to form the GaP window layer 5 on the cladding layer 4A and 4B. Thus, the semiconductor light emitting element of this example is obtained.

Here, in order to bond a GaP substrate or a GaP layer to the cladding layer by using a wafer bonding technique, the bonding surfaces are processed appropriately, heated in a predetermined atmosphere, and kept contacted for a predetermined time.

SECOND EXAMPLE

Figure 10:
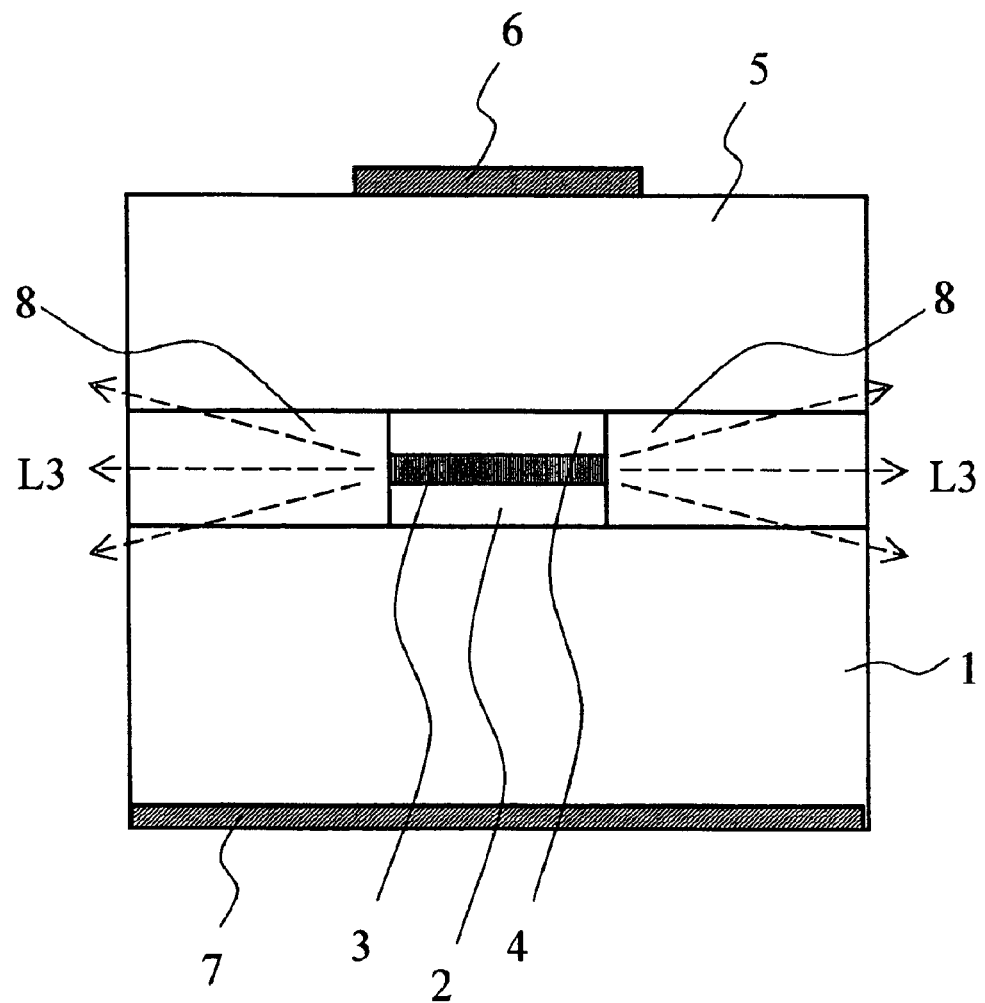
FIG. 10 is a schematic diagram showing the cross-sectional structure of the semiconductor light emitting element according to the second example of the invention.

FIG. 10 is a schematic diagram showing the cross-sectional structure of the semiconductor light emitting element according to the second example of the invention. The same symbols are given to the same elements as what were mentioned above with reference to FIG. 9 about this figure, and detailed explanation will be omitted.

In the light emitting element of this example, the double-heterostructure which consists of the InAlP cladding layer 2, the InGaAlP active layer 3, and the InAlP cladding layer 4 is formed near the center of the element, and the InGaAlP current blocking layer 8 surrounds the element. If the current blocking layer 8 is made transparent at the emission wavelength of the light emitted from the active layer 3 by adjusting the composition of the current blocking layer 8, the light L3 emitted from the side surface (facet) of the active layer 3 can be made to emit outside from the side surface of the element with a low loss.

In order to reduce the absorption of the light in the current blocking layer 8, it is desirable to made the bandgap of the current blocking layer 8 be wider than the average of the bandgap of the active layer 3. On the other hand, since it is necessary to prevent the total reflection on the active layer 3 in order to extract the light from the side surfaces of the active layer 3 towards the current blocking layer 8 efficiently, the refractive index of the current blocking layer 8 must be low. That is, it is desirable to make the refractive index of the current blocking layer 8 be lower than the refractive indexes of the cladding layer 2 under the active layer and the cladding layer 4 on the active layer.

When these conditions are satisfied, the light can be efficiently extracted from the side surfaces of the active layer 3 towards the current blocking layer. Furthermore, the absorption in the current blocking layer 8 of the light can also be controlled.

For example, with regard to the Al composition x in $In_{0.5}(Ga_{1-x}Al_x)_{0.5}P$, the upper and lower cladding layers 2 and 4 may be made of InAlP (i.e. x=1), and the active layer 3 may have the MQW structure which consists of a barrier layer of x=0.6 and a well layer of x=0.06. In the case of the current blocking layer 8, the Al composition x may be 0.7 through 0.8 (i.e. $In_{0.5}(Ga_{0.3}Al_{0.7})_{0.5}P$ through $In_{0.5}(Ga_{0.2}Al_{0.8})_{0.5}P$).

Such a current blocking layer 8 can be formed by selective epitaxial growth technique. That is, the double-heterostructure which consists of the cladding layer 2, the active layer 3, and the cladding layer 4 is formed on a GaAs substrate which is not illustrated. Then, the double-heterostructure is bonded on the GaP substrate 1, and the GaAs substrate is removed. A mask pattern which consists of $SiO_2$ etc. is formed in a part of the surface of the double-heterostructure, and the regions of the double-heterostructure where the mask pattern is not formed is removed by etching.

While leaving this mask as it is, the current blocking layer 8 which is transparent to the wavelength of the emission and is of high resistance (undoped) is formed by a crystal growth with the same thickness as the double-heterostructure. By adjusting the growth conditions appropriately in the MOCVD procedure etc., so-called "selective epitaxial growth" where the crystal growth does not occur on the mask can be carried out. After removing the mask, the GaP window layer 5 is formed by using a wafer bonding technique or crystal growth on the double-heterostructure. Thus, the principal part of the light emitting element of this example is completed.

As explained above, according to this example, it becomes possible to improve sharply the light extraction efficiency from the active layer 3 by providing the active layer 3 in the center of the light emitting element selectively and by surrounding it by the current blocking layer which is transparent to the wavelength of the emission and is of high resistance.

THIRD EXAMPLE

Figure 11:
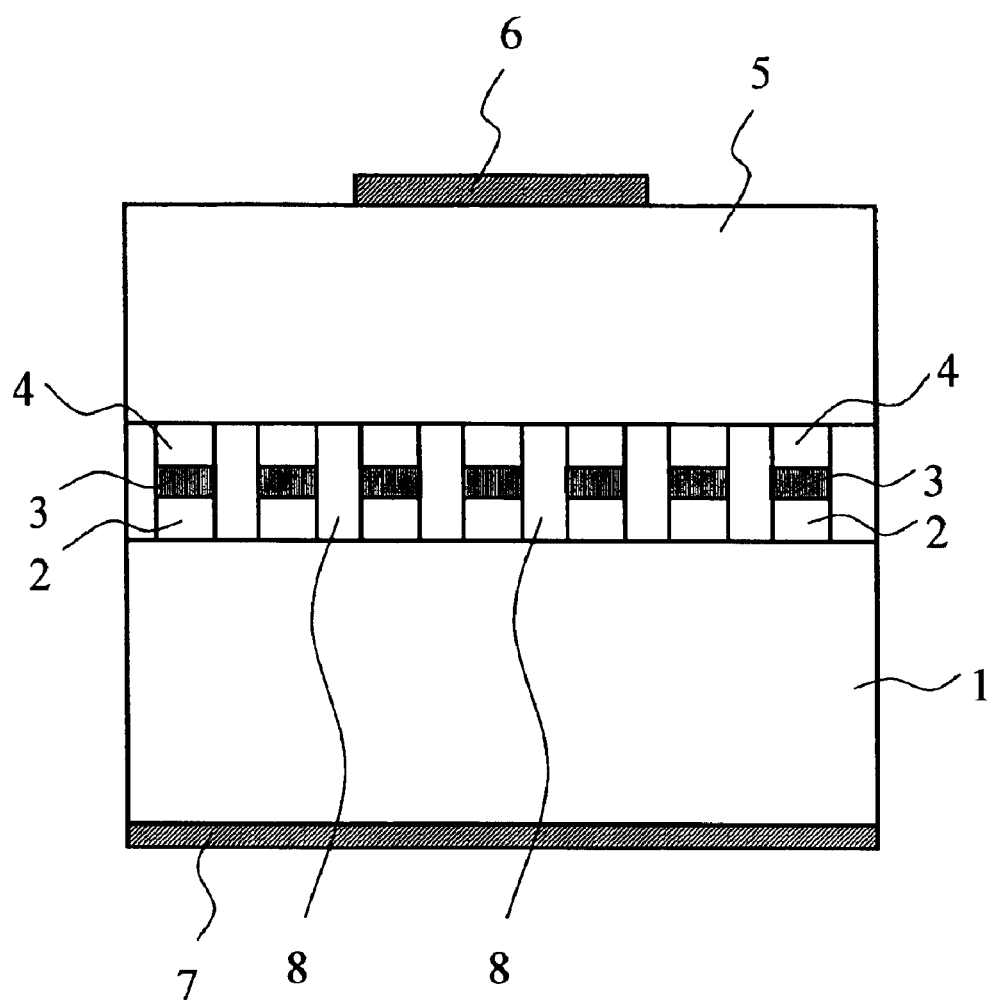
FIG. 11 is a schematic diagram showing the cross-sectional structure of the semiconductor light emitting element according to the third example of the invention.

FIG. 11 is a schematic diagram showing the cross-sectional structure of the semiconductor light emitting element according to the third example of the invention. The same symbols are given to the same elements as what were mentioned above with reference to FIG. 9 through FIG. 10 about this figure, and detailed explanation will be omitted.

The light emitting element of this example has the structure according to the second embodiment of the invention. That is, in the light emitting element of this example, a plurality of double-heterostructures containing the active layers 3 are surrounded by the current blocking layer 8. The material of each element may be same as that of what was mentioned above about the second example.

According to this example, as mentioned above about the second embodiment, a plurality of light sources (active layers 3) can be appropriately arranged inside the light emitting element, and the light emitted from each light source to the circumference can be efficiently extracted outside. Moreover, losses produced by guided and absorbed inside the active layers 3 can be reduced by forming the active layers 3 in a small size.

The light emitting element of this example can also be manufactured by combining the wafer bonding technique and the selective epitaxial growth, as mentioned above about the first and the second example.

Furthermore, it is also possible to make a part or the whole of the semiconductor substrate 1 or the semiconductor window layer 5 with a material other than semiconductors, such as conductive plastics. For example, the double-heterostructure may be grown up over the semiconductor buffer layer on a GaAs substrate which is not illustrated, the current blocking layer 8 is embedded after a patterning process and the window layer 5 consisting of the semiconductor may be grown up. And, etching removal of the GaAs substrate can be carried out, and the light emitting element may be bonded on the substrate which consists of a material other than semiconductors, such as conductive plastics, on the back of the semiconductor buffer layer. Then, the semiconductor light emitting element which has the substrate which consists of a material other than a semiconductor is obtained.

When material, such as conductive plastics, is used as the substrate, the advantage of being easy to process and control thickness is acquired.

FOURTH EXAMPLE

Figure 12:
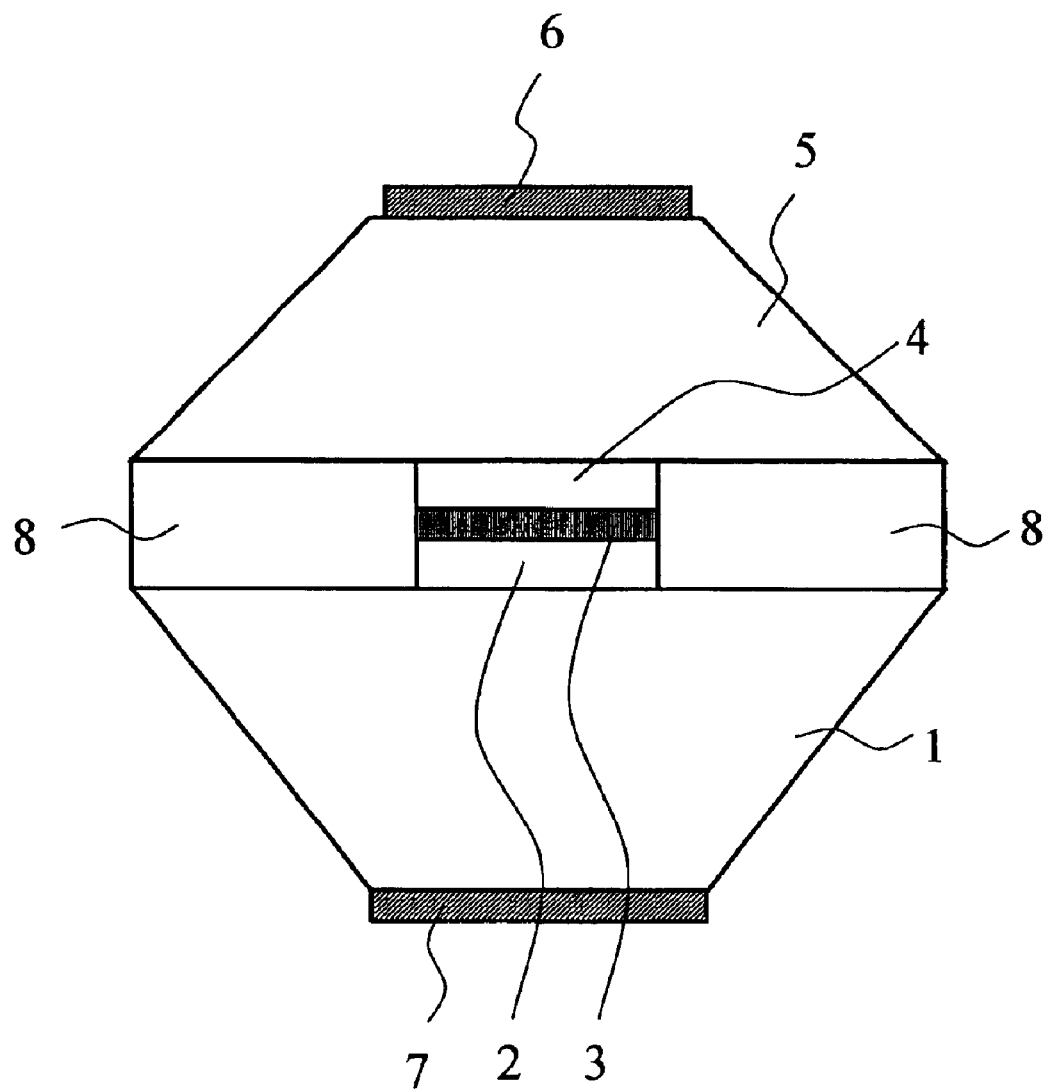
FIG. 12 is a schematic diagram showing the cross-sectional structure of the semiconductor light emitting element according to the forth example of the invention.

FIG. 12 is a schematic diagram showing the cross-sectional structure of the semiconductor light emitting element according to the fourth example of the invention. The same symbols are given to the same elements as what were mentioned above with reference to FIG. 9 through FIG. 11 about this figure, and detailed explanation will be omitted.

In this example, the side surfaces of the substrate 1 and the window layer 5 are slope, and electrodes 6 and 7 are provided on the narrowed surfaces which are on the window layer 5 and under the substrate 1. By employing such a "lantern" configuration, it becomes possible to improve the light extraction efficiency further.

Figure 13:
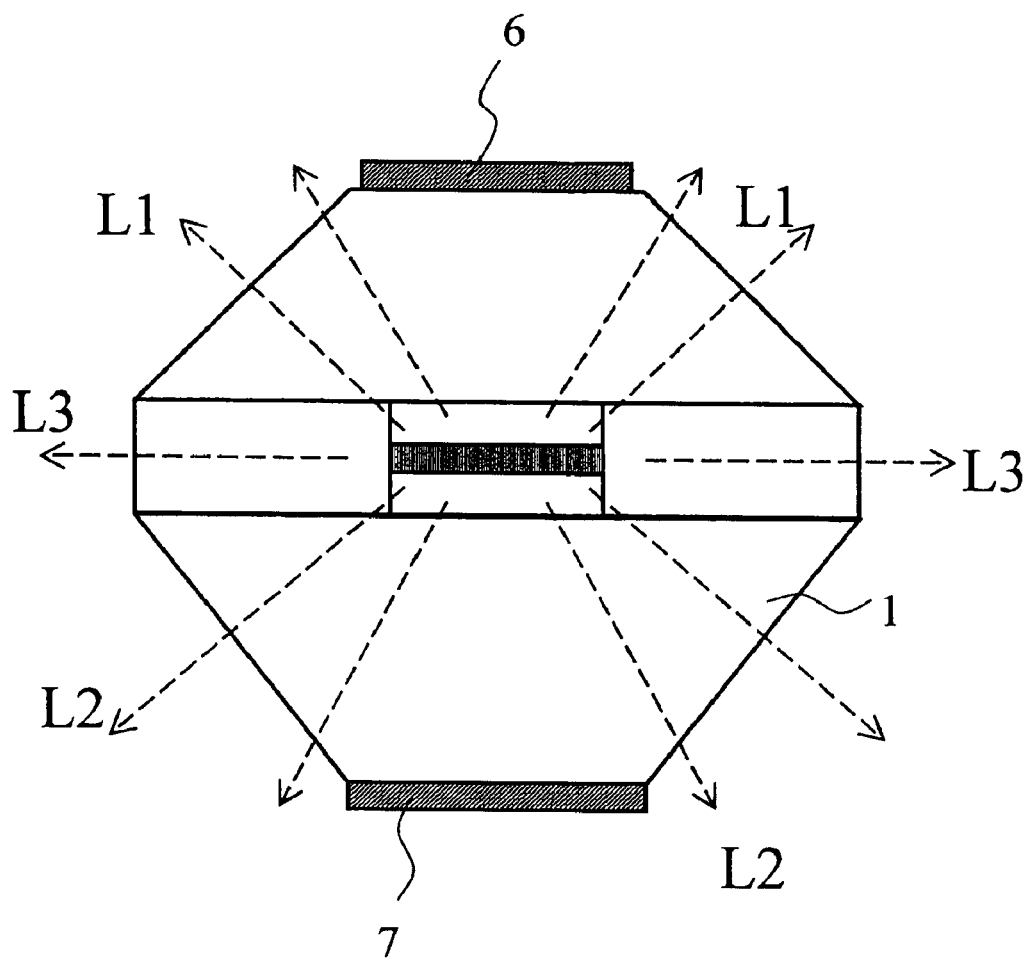
FIG. 13 is a schematic diagram for explaining the extraction paths of the light in the light emitting element of the forth example.

FIG. 13 is a schematic diagram for explaining the extraction paths of the light in the light emitting element of this example. According to this example, the light emitted outside from the active layer 3 can reach the surfaces (or side) of the light emitting element in an almost perpendicular direction. Consequently, the total reflection becomes less frequent on the surfaces and the sides of the element, and the light extraction efficiency can be improved.

Furthermore, the light obstruction by the upper electrode 6 and the lower electrode 7 can be suppressed by making these electrodes smaller.

That is, according to this example, it becomes possible to extract the light emitted to the surrounding from the active layer 3 outside the element with higher efficiency.

The form of the substrate 1 and the window layer 5 in this example may be, for example, a cone or a pyramid. Moreover, these forms can be realized by various kinds of methods, such as the method of using the difference in the etching rate with the crystal directions, and the method of etching from a slanting direction using an anisotropic etching technique such as an ion milling and RIE.

Also in this example, a part or the whole of the substrate 1 or the window layer 5 can be made of a material which is not semiconductors but conductive plastics, as mentioned above about the third example. Since the substrate 1 and window layer 5 which are formed with conductive plastics etc. are easy to be processed, it become easy to acquire the form of the "lantern" which is expressed in FIG. 12.

Moreover, it is also possible to apply this example to the second embodiment. That is, in the light emitting element in which a plurality of active layers are arranged as mentioned above about FIG. 3 through FIG. 7, the upper and lower substrate 1 and the window layer 5 may have aslant sides as expressed in FIG. 12 and FIG. 13.

THE FIFTH EXAMPLE

Figure 14:
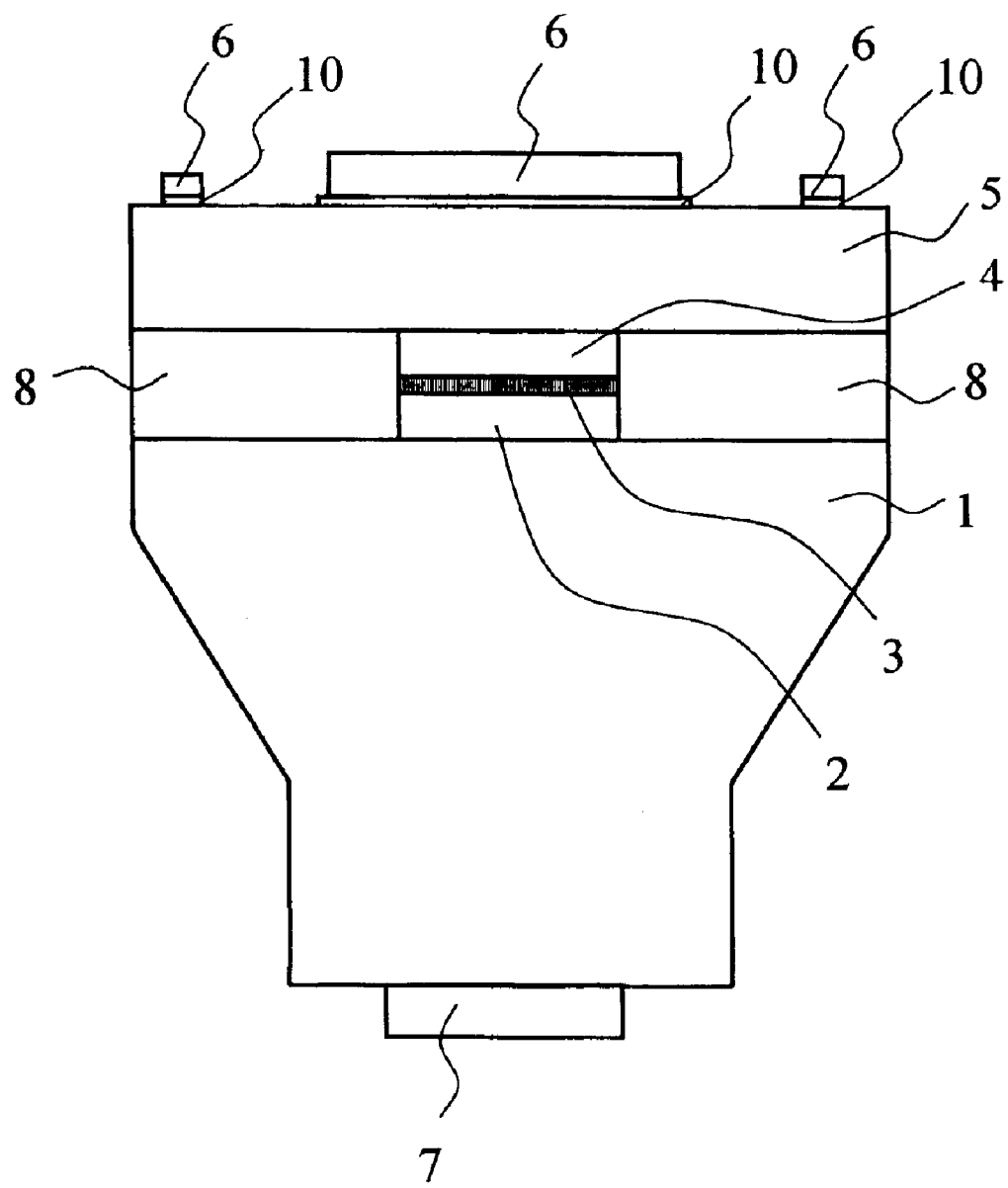
FIG. 14 is a schematic diagram showing the cross-sectional structure of the semiconductor light emitting element according to the fifth example of the invention.
Figure 15:
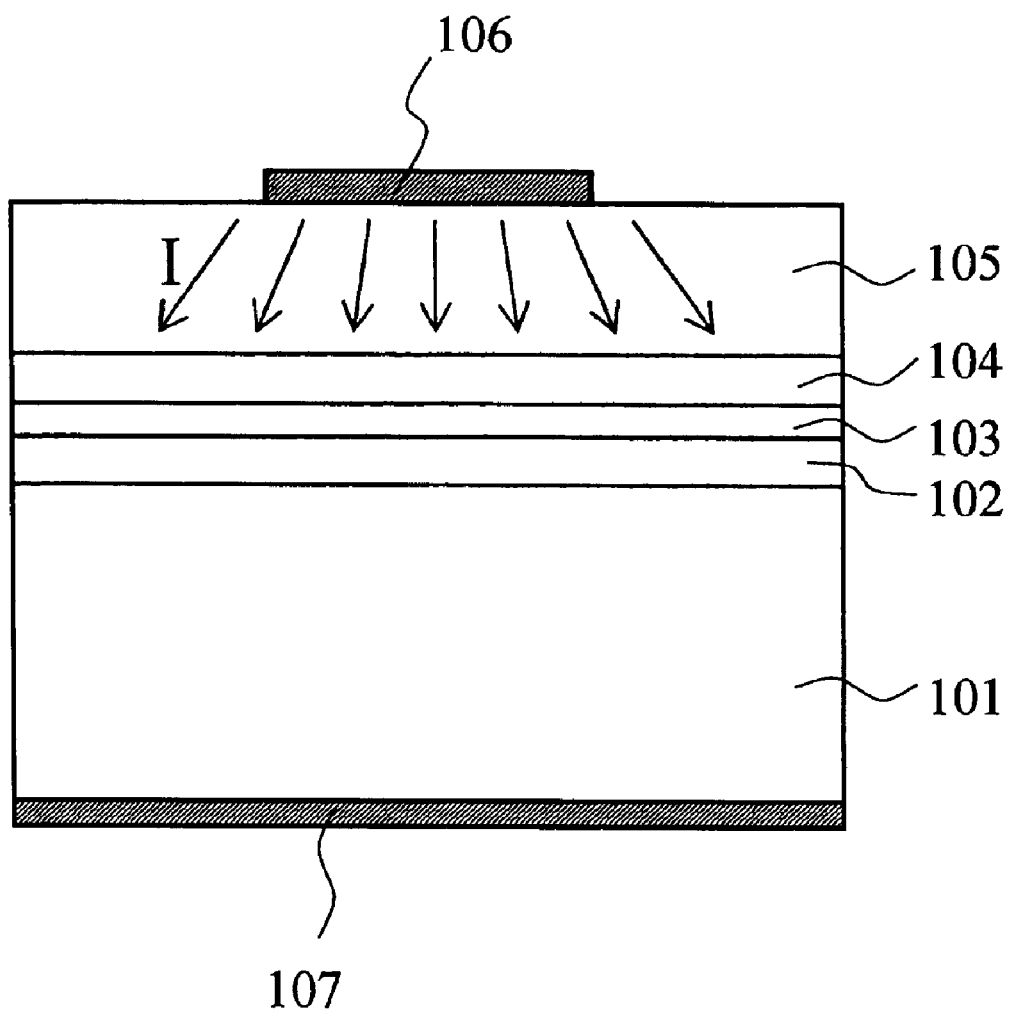
FIG. 15 is a schematic diagram showing the cross-sectional structure of a conventional light emitting diode.

FIG. 14 is a schematic diagram showing the cross-sectional structure of the semiconductor light emitting element according to the fifth example of the invention. The same symbols are given to the same elements as what were mentioned above with references to FIG. 9 through FIG. 13 about this figure, and detailed explanation will be omitted.

In this example, slopes are provided in the sides of the substrate 1 and the light extraction efficiency from the portion is improved. Moreover, the n-type contact layer 10 is provided between the upper (n-side) electrode 6 and the window layer 5. The n-type contact layer 10 serves to reduce the contact resistance.

Material of each part can be, for example, the same as that of what was mentioned above about the first example. The examples are as the following.

For example, the substrate 1 may be made of p-type GaP (thickness of 250 micrometers), the cladding layer 2 p-type is made of InAlP (thickness of 1.0 micrometers), the active layer 3 has the MQW structure where the barrier layer (thickness of 8 nm) of aluminum composition x=0.6 and the well layer (thickness of 5 nm) of aluminum composition x=0.07 are laminated for 20–40 cycles, the cladding layer 4 is made of n-type InAlP (thickness of 0.6 micrometers), the window layer 5 is made of n-type InGaAlP of aluminum composition x=0.3, the current blocking layer 8 is made of InGaAlP of aluminum composition x=0.7–0.8, the contact layer is made of n-type GaAs (thickness of 0.1 micrometers), the electrode 6 has a lamination of AuGe/Au, and the electrode 7 has a lamination of AuZn/Au.

Also in this example, the light extraction efficiency can be improved by arranging the active layer 3 near the center of the element. Moreover, it becomes possible to extract the light from the side of the active layer 3 before the light guided inside the active layer 3 is absorbed and decreases.

Moreover, also in this example, as mentioned above about the third example, a part or the whole of the substrate 1 or the window layer 5 can be made of the material which is not semiconductors but conductive plastics. Since the substrate 1 and window layer 5 which are formed with conductive plastics etc. are easy to be processed, it become easy to acquire the form of the "lantern" which was expressed in FIG. 12.

Moreover, it is also possible to apply this example to the second embodiment. That is, in the light emitting element in which a plurality of active layers are arranged as mentioned above about FIG. 3 through FIG. 7, the structure expressed in FIG. 14 can be adopted.

Heretofore, the embodiments of the present invention have been explained, referring to the examples. However, the present invention is not limited to these specific examples.

For example, about the structure, the material, the form, the thickness, and the arrangement of each element including double-heterostructure which are provided in the semiconductor light emitting element of the invention, may be appropriately selected by those skilled in the art with the known techniques to carry out the invention as taught in the specification and obtain equivalent effects.

More specifically, as materials which constitutes the semiconductor light emitting element of the invention, various kinds of material, such as an AlGaAs alloy system, an InP alloy system, and one of nitride gallium (GaN) alloy system besides InGaAlP alloy system can be used.

What is claimed is:

1. A semiconductor light emitting diode comprising:
   a first layer;
   a semiconductor light emitting layer selectively provided on the first layer;
   a current blocking layer of high resistance surrounding the semiconductor light emitting layer on the first layer;
   a second layer provided on the semiconductor light emitting layer and the current blocking layer;
   a first electrode provided on the second layer; and
   a second electrode provided on the back of the first layer,
   a part of a light emitted from the semiconductor light emitting layer being emitted outside through the first layer, and
   a part of the light emitted from the semiconductor light emitting layer being emitted outside through the second layer.

2. The semiconductor light emitting diode according to claim 1, wherein a main component of the current blocking layer is same as a main component of the semiconductor light emitting layer, and the current blocking layer includes an impurity which is not included in the semiconductor light emitting layer.

3. The semiconductor light emitting diode according to claim 1, wherein the current blocking layer is made of a semiconductor whose bandgap is wider than a bandgap of the semiconductor light emitting layer.

4. The semiconductor light emitting diode according to claim 3, further comprising:
   a first cladding layer which is provided between the first layer and the semiconductor light emitting layer and made of a semiconductor whose bandgap is wider than the bandgap of the semiconductor light emitting layer; and
   a second cladding layer which is provided between the first layer and the semiconductor light emitting layer and made of a semiconductor whose bandgap is wider than the bandgap of the semiconductor light emitting layer,
   wherein a refractive index of the current blocking layer is smeller than a refractive index of the light emitting layer, and the refractive index of the current blocking layer is greater than refractive indexes of the first and second cladding layers.

5. The semiconductor light emitting diode according to claim 1, wherein at least one of the first and second layers has a slope on a side.

6. The semiconductor light emitting diode according to claim 1, wherein:
   at least one of the first and second layers is made of GaP, and
   the semiconductor light emitting layer includes InGaAlP.

7. The semiconductor light emitting diode according to claim 1, wherein at least one of the first and second layers is made of a material other than semiconductors.

8. The semiconductor light emitting diode according to claim 1, wherein a lateral size of the semiconductor light emitting layer is 20 micrometers or less.

9. The semiconductor light emitting diode according to claim 1, further comprising a conductive layer provided at least one of between the first layer and the second electrode and between the second layer and the first electrode, wherein the conduction layer is made of a material other than semiconductors and allows the light emitted from the semiconductor light emitting layer to pass therethrough.

10. A semiconductor light emitting diode comprising:

a first layer;

a plurality of semiconductor light emitting layers selectively provided on the first layer, the semiconductor light emitting layers being separated from each other;

a current blocking layer of high resistance provided among the semiconductor light emitting layers on the first layer;

a second layer provided on the semiconductor light emitting layer and the current blocking layer;

a first electrode provided on the second layer; and a second electrode provided on the back of the first layer, a part of a light emitted from the semiconductor light emitting layers being emitted outside through the first layer, and a part of the light emitted from the semiconductor light emitting layers being emitted outside through the second layer.

11. The semiconductor light emitting diode according to claim 10, wherein a distance between the semiconductor light emitting layers is greater near a center of the semiconductor light emitting diode than a distance between the semiconductor light emitting layers near edges of the semiconductor light emitting diode.

12. The semiconductor light emitting diode according to claim 10, wherein a distance between the semiconductor light emitting layers is smaller near a center of the semiconductor light emitting diode than a distance between the semiconductor light emitting layers near edges of the semiconductor light emitting diode.

13. The semiconductor light emitting diode according to claim 10, wherein a main component of the current blocking layer is same as a main component of the semiconductor light emitting layers, and the current blocking layer includes an impurity which is not included in the semiconductor light emitting layers.

14. The semiconductor light emitting diode according to claim 10, wherein the current blocking layer is made of a semiconductor whose bandgap is wider than a bandgap of the semiconductor light emitting layers.

15. The semiconductor light emitting diode according to claim 14, further comprising:

a first cladding layer which is provided between the first layer and the semiconductor light emitting layers and made of a semiconductor whose bandgap is wider than the bandgap of the semiconductor light emitting layers; and a second cladding layer which is provided between the first layer and the semiconductor light emitting layers and made of a semiconductor whose bandgap is wider than the bandgap of the semiconductor light emitting layers, wherein a refractive index of the current blocking layer is smaller than a refractive index of the light emitting layers, and the refractive index of the current blocking layer is greater than refractive indexes of the first and second cladding layers.

16. The semiconductor light emitting diode according to claim 10, wherein at least one of the first and second layers has a slope on a side.

17. The semiconductor light emitting diode according to claim 10, wherein:

at least one of the first and second layers is made of GaP, and the semiconductor light emitting layers include InGaAlP.

18. The semiconductor light emitting diode according to claim 10, wherein at least one of the first and second layers is made of a material other than semiconductors.

19. The semiconductor light emitting diode according to claim 10, wherein a size of the semiconductor light emitting layers is 20 micrometers or less.

20. The semiconductor light emitting diode according to claim 1, further comprising a conductive layer provided at least one of between the first layer and the second electrode and between the second layer and the first electrode, wherein the conduction layer is made of a material other than semiconductors and allows the light emitted from the semiconductor light emitting layer to pass therethrough.

21. The semiconductor light emitting diode according to clam 1, wherein a part of a light emitted from a side surface of the semiconductor light emitting layer is emitted outside through the current blocking layer.

22. The semiconductor light emitting diode according to claim 10, wherein a part of a light emitted from side surfaces of the semiconductor light emitting layers is emitted outside through the current blocking layer.

* * * * *